Oct. 29, 1968 D. P. SANDERS 3,408,238

USE OF BOTH SILICON OXIDE AND PHOSPHORUS OXIDE TO MASK AGAINST DIFFUSION OF INDIUM OR GALLIUM INTO GERMANIUM SEMICONDUCTOR DEVICE

Filed June 2, 1965

INVENTOR:

DONALD P. SANDERS

E. Mickey Hubbard

ATTORNEY

United States Patent Office 3,408,238

Patented Oct. 29, 1968

3,408,238

USE OF BOTH SILICON OXIDE AND PHOSPHORUS OXIDE TO MASK AGAINST DIFFUSION OF INDIUM OR GALLIUM INTO GERMANIUM SEMICONDUCTOR DEVICE

Donald P. Sanders, Richardson, Tex., assignor to Texas Instruments Incorporated, Dallas, Tex., a corporation of Delaware Filed June 2, 1965, Ser. No. 460,785
15 Claims. (Cl. 148—187)

ABSTRACT OF THE DISCLOSURE

This specification discloses an improvement in the process of diffusing a P-type dopant into a germanium semiconductor device, characterized by employing both a silicon oxide and a phosphorous oxide in the film used to mask the germanium, selectively etching an opening in the film and diffusing the P-type dopant into the germanium. A detailed description of employing the improved process in conjunction with other steps to form multiple junction transistors is included. Furthermore, the known procedures of film deposition, selective etching and diffusion are described in detail.

Figures 1, 2:
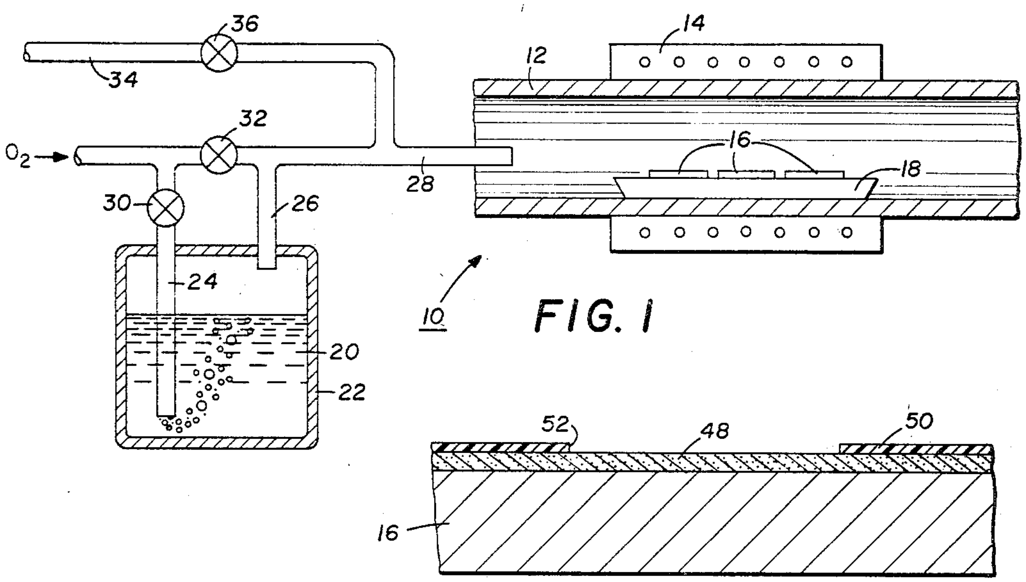

This invention relates generally to the fabrication of semiconductor devices, and more particularly, but not by way of limitation, relates to a process for diffusing P-type doping impurities, such as indium and gallium, into selected regions of a semiconductor substrate such as germanium to form a PN junction, and to a process for fabricating double-diffused planar germanium transistors.

It is generally recognized that high frequency transistors can best be made from germanium rather than silicon, because of higher carrier mobilities. For operation at high frequency, however, the actual operating parts of the emitter, base and collector regions must have small physical dimensions, and the base width must be narrow and controlled within a tight tolerance. At frequencies in the 5 gc. range or greater, the area of the emitter region, for example, is preferably smaller than a few tenths of a square mil.

These dimensional requirements make conventional procedures used to fabricate germanium transistors unsuitable. The metal mask customarily employed to evaporate emitter and base stripes are unwieldy when working with such small dimensions, and further are not suited for complex geometries. Use of alloy dots is impracticable as a production method because the dots or stripes necessary for such small size, for example a sphere having a one-fourth mil diameter, are invisible to the naked eye and virtually impossible to handle with ordinary production aids such as tweezers. Even if alloyed emitters could be produced having such small dimensions, the problem of making contact with the emitter would still exist. Also, at extremely small sizes, for example 0.1 mil, the grain size of deposited metals is a limitation upon the line resolution which can be attained. Further, during alloying the emitter region tends to spread and destroy the fine geometry and dimensions required.

Silicon transistors and integrated circuits, on the other hand, can be frabricated with these small sizes using existing planar techniques in which a silicon oxide film is patterned by photolithographic techniques to serve as a deffusion mask. However semiconductor silicon has undesirable electrical characteristics at high frequencies since the carrier mobilities are only about one-third to one-fourth that of germanium. The conventional planar techniques used to fabricate silicon semiconductor devices have not heretofore been applicable to germanium devices because of the absence of a suitable diffusion mask against P-type dopants, i.e., indium and gallium, which can also be patterned by photomasking and etching techniques to define the junction and contact areas. Germanium dioxide is not a good diffusion mask against these dopants because it converts to a monoxide which sublimes at fairly low temperatures and is also fairly water soluble. While it has been recognized that silicon oxide can be applied to a germanium surface by oxidative techniques, then selectively etched to create a diffusion mask, this material has not been employed because silicon oxide does not constitute a barrier against either indium or gallium, which are the two principal P-type dopant materials for germanium, and because of the degraded device characteristic which results.

The principal object of this invention is to provide an improvement in the process wherein there is effected a diffusion mask for P-type germanium dopants for use in fabricating germanium semiconductor devices.

A further object is to provide a process which permits the fabrication of germanium semiconductor devices having a planar configuration.

Still another object is to provide a process for diffusing P-type doping impurities such as indium or gallium into selected regions of a germanium substrate.

Yet another object of the invention is to provide a process for fabricating a planar germanium transistor using a double diffusion process.

These and other objects are accomplished in accordance with this invention by the use of a phosphorus doped silicon oxide film as a diffusion mask against doping materials. The masking film may be formed by passing an oxygen stream carrying suitable silicon compound vapors and phosphorus compound vapors over a germanium substrate at an elevated temperature to form a mixed oxide film by an oxidation and decomposition reaction. The diffusion mask may be patterned in any desired manner by conventional photolithographic and selective etching techniques. The film is effective against indium (In) and gallium (Ga), the two principal P-type doping impurities for germanium semiconductor material, as well as aluminum (Al) and most other P-type doping impurities.

The novel features believed characteristic of this invention are set forth in the appended claims. The invention itself, however, as well as other objects and advantages thereof, will best be understood by reference to the following detailed description of illustrative embodiments when read in conjunction with the accompanying drawings, wherein:

FIGURE 1 is a schematic diagram of apparatus which may be used to carry out the process of the present invention; and FIGURES 2–5 are schematic sectional views which serve to illustrate steps in the fabrication of a typical semiconductor device.

Referring now to the drawings, and in particular to FIGURE 1, a typical apparatus which may be used in carrying out the process of the present invention is indicated generally by the reference numeral 10. The apparatus 10 comprises a standard quartz tube furnace 12 having a heating coil 14 controlled by a suitable thermostatic system for maintaining a zone within the tube precisely at a preselected temperature. Semiconductor slices 16 are supported in the heated zone of the furnace by means of a boat 18. Liquids 20 from which reactant vapors are derived are contained within a closed receptacle 22. Oxygen is forced through the reactant solution 20 by means of a submerged conduit 24 and entrained reactant vapors pass through the conduit 26 and conduit 28 to the tube furnace 12. By closing the valve 30 in the conduit 24, and opening valve 32 in the bypass conduit, oxygen may be made to bypass the container 22 and pass directly through the conduit 28 into the tube furnace 12. Hydrogen, nitrogen or oxygen, or any combination thereof, may be selectively passed through the conduit 34 and valve 36 and mixed with the gas in the conduit 28 prior to introduction to the tube furnace 12.

Assume now that an NPN transistor is to be fabricated using the process of this invention. An 0.018 ohm-centimeter N-type germanium slice 16 is placed on the boat 18. The reactant liquid 20 includes a source of silicon, such as liquid tetraethoxysilane or triethoxysilane, and a source of phosphorus, such as trimethyl phosphate or triethyl phosphate. The liquid solution 20 is preferably from about one part to about twenty parts tetraethoxysilane to about one part trimethyl phosphate. If desired, each of the reactant compounds may be contained in a separate vessel and the carrier gases then mixed in the desired ratio. Using these reactants, a layer 48 of $SiO_2$-$P_2O_5$ is deposited on the surface of the germanium wafer 16. This is accomplished by first closing valves 30 and 32 and passing an $H_2$:$N_2$ mixture through valve 36 at a rate sufficient to purge other gases from the tube furnace 12 while the semiconductor slices 16 are warmed for about five minutes to a temperature of about 500° C. Any temperature in the range of from about 400° C. to about 550° C. is satisfactory. Then the valve 30 is opened and oxygen bubbled through the reactant fluid 20 so that vapors of the reactant fluid, which is at room temperature, will be entrained in the oxygen stream. Additional oxygen is introduced through the valve 36 and mixed with the reactant vapors in the conduit 28. A combined flow rate sufficient to purge other gases from the tube furnace 12 is maintained for a period sufficient to deposit the desired thickness on the surface of the semiconductor slices. A flow rate of oxygen and vapor from the conduit 26 of about two liters per minute and a flow rate of excess oxygen through the valve 36 of about six liters per minute has been found satisfactory for a 2.5 inch diameter tube furnace. After about fifteen minutes, a layer 48 of $SiO_2$-$P_2O_5$ approximately 2,000 A. thick is formed as a result of a calculated deposition rate of about 130 A. per minute.

The film thus formed is then used to fabricate a transistor using conventional photolithographic patterning and diffusing techniques. For example, a layer of photo-resist 50 may be formed over the silicon-phosphorus oxide layer, exposed to light, and developed to open a window 52 in the photo-resist as illustrated in FIGURE 2. The semiconductor slice was then immersed in a suitable etchant, such as a buffered solution of hydrofluoric acid, and the oxide layer 48 removed to leave a window 54 and expose the germanium substrate 16. Of course, a very thin germanium oxide layer reforms over the exposed surface of the germanium when the substrate is exposed to air, but this is of no consequence. The photo-resist 50 is then stripped from the substrate.

Figure 3:
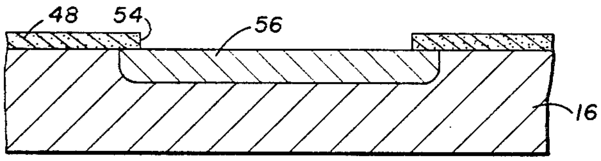
Figure 4:
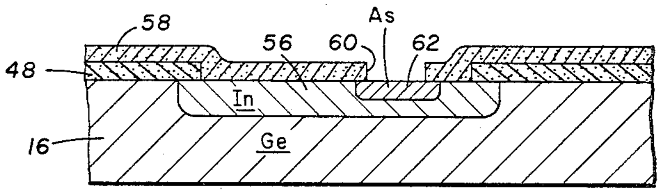
Figure 5:
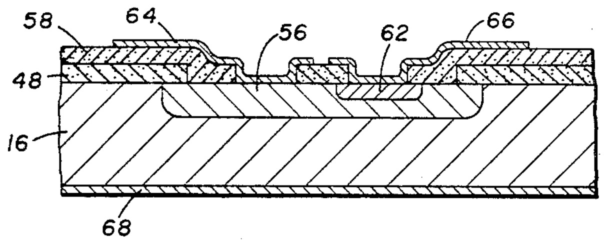

Next, indium is diffused through the opening 54 in the layer 48 to form a P-type diffused region 56 as illustrated in FIGURE 3. The indium diffusion can be made from indium bromide vapor using a conventional tube furnace with dual temperature zones and conventional techniques, the diffusion taking place at about 880° C. for about fifteen minutes. A second oxide layer 58 (FIGURE 4), such as silicon oxide, is then deposited and an emitter diffusion opening 60 cut by photolithographic techniques. The silicon dioxide may be deposited using the same process as for depositing $SiO_2$-$P_2O_5$ except that the phosphorus compound may be omitted. Arsenic is then diffused through the opening 60 to form an emitter region 62. A base contact opening is then cut in the oxide layer 58 over the base region, and a metallized film deposited on the surface and patterned to leave expanded base and emitter contacts 64 and 66 (FIGURE 5). A metallized film 68 is then formed over the back of the substrate to form a collector contact which can be bonded to the header.

A PNP transistor can be fabricated using the same process except that the starting slice would be P-type germanium, the base diffusion would be arsenic or other N-type doping material made through a silicon oxide mask, and the emitter region would be made by diffusing gallium, or other P-type doping material, through a silicon-phosphorus oxide mask.

The manner in which the phosphorus-doped silicon oxide film acts as a diffusion mask against the P-type doping impurities indium and gallium, is not known with certainty. It is speculated that the phosphorus either acts as a compensating N-type source which first occupies the available lattice sites in the germanium and over-compensates the entrance of the indium, gallium, aluminum or other P-type dopant which enters the germanium lattice structure, or acts as a diffusion barrier which actually blocks the passage of the doping impurities through the masking film. In either event, the desired result of establishing a PN junction between the unmasked and masked regions of the germanium is effected. It is believed that the film acts as a barrier rather than as a compensating source. Since phosphorus is an N-type impurity and will diffuse into germanium, it may be desirable in some instances to place a diffusion barrier, such as silicon oxide which is a known phosphorus diffusion barrier, between the silicon-phosphorus oxide film and the germanium in which case the silicon-phosphorus oxide film is relied upon as a barrier.

Although the precise chemistry of the silicon-phosphorus oxide film is very complex and not readily ascertainable, it is believed that the film is comprised of $SiO_2$ and $P_2O_5$. The ratio of silicon oxide to phosphorous oxide in the masking film is not thought to be highly critical. For example it is believed that the ratio may range from about two thousand to one down to about twenty to one, silicon oxide to phosphorous oxide. Similarly, the thickness of the film may vary from 2,000 A., limited only by what empirical data demonstrates is impractical for a given application.

Although preferred embodiments of the invention have been described in detail, it is to be understood that various changes, substitutions and alterations can be made in the process materials, steps and resulting devices without departing from the spirit and scope of the invention as defined by the appended claims.

What is claimed is:

1. In a process for fabricating a germanium semiconductor device useful in high frequency applications, the steps of:

forming a film comprised of silicon oxide and phosphorous oxide over a germanium semiconductor substrate, selectively removing the film in a preselected area to expose the surface of the germanium substrate, and diffusing a P-type doping impurity of either induim or gallium into the exposed area of said substrate which has been heated to a suitably high temperature to form a P-type region only thereat and not in areas covered by said film, and to form a PN junction between the exposed region of the substrate and the region masked by the film.

2. The process defined in claim 1 wherein the film is comprised of from about two thousand (2,000) parts to about twenty (20) parts silicon oxide and about one part phosphorous oxide.

3. The process defined in claim 2 wherein the oxides are silicon dioxide and phosphorus pentoxide.

4. The process defined in claim 1 wherein said film is formed by passing a gaseous mixture comprised of oxygen, a silicon compound vapor and a phosphorous compound vapor over the surface of said heated germanium substrate.

5. The process defined in claim 4 wherein the gaseous mixture is derived by passing oxygen through a mixture of from about twenty parts to about one part tetraethoxysilane and one part trimethyl phosphate.

6. The process defined in claim 5 wherein the temperature of the substrate is maintained at from about 400° C. to about 550° C.

7. In a process for fabricating a double-diffused planar germanium transistor, the steps of:

forming a silicon oxide-phosphorous oxide layer, over a surface of an N-type monocrystalline germanium slice, having an opening therein, diffusing a P-type doping material of either indium or gallium through the opening into the germanium to form a base region and a collector-base junction, forming a silicon oxide layer, over the base region and over said silicon oxide-phosphorous oxide layer, having an opening therein over a portion of the base region, and diffusing an N-type doping material through said opening in the silicon oxide layer to form an emitter region and a base-emitter junction.

8. The process steps defined in claim 7 wherein the P-type doping material is indium.

9. The process steps defined in claim 7 wherein the N-type doping material is arsenic.

10. The process steps defined in claim 7 wherein the P-type doping material is indium and the N-type doping material is arsenic.

11. In a process for fabricating a double-diffused, planar germanium transistor, the steps of:

forming a silicon oxide layer, over a surface of a P-type monocrystalline germanium slice, having an opening therein, diffusing an N-type doping material through the opening into the germanium to form a base region and a collector-base junction, forming a silicon oxide-phosphorous oxide layer, over the base region and over the silicon oxide layer, having an opening therein over a portion of the base region, and diffusing a P-type doping material of either indium or gallium through the opening in the silicon oxide-phosphorous oxide layer to form an emitter region and a base-emitter junction.

12. The process steps defined in claim 11 wherein the P-type doping material is gallium.

13. The process steps defined in claim 11 wherein the N-type doping material is arsenic.

14. The process steps defined in claim 11 wherein the P-type doping material is gallium and the N-type doping material is arsenic.

15. A method of making a P-type diffusion region in germanium semiconductor material to form a high frequency semiconductor device, the steps comprising:

(a) emplacing said germanium semiconductor material in a temperature controlled zone in a furnace, and initially controlling the temperature in the range of 400–550° C., (b) bubbling oxygen through a reactant fluid in a container, said reactant fluid comprising from 1–20 parts of an organic silane of either triethoxysilane or tetraethoxysilane to one part of trimethyl phosphate, entraining said reactant fluid in said oxygen, (c) mixing about 3 parts by volume of oxygen with each part by volume of the stream of said oxygen containing said reactant fluid to form a combined stream, (d) passing said combined stream over and in contact with said germanium semiconductor material at the temperature prevailing in said temperature controlled zone until a silicon oxide-phosphorous oxide film about 2000 A. thick is formed on said germanium, (e) etching away a selected window of said film to expose an area of germanium substrate, (f) emplacing said germanium semiconductor material with said film and said exposed area in said temperature controlled zone, and controlling the temperature at about 880° C., and (g) passing vapor containing atoms of a P-type dopant of either indium or gallium over and in contact with said film over said germanium and said areas of bare germanium, whereby said atoms of said P-type dopant selectively diffuse into said germanium through said areas of bare germanium to create a localized P-type diffusion region only in said bare area and not in areas covered by said film of said silicon oxide and said phosphorous oxide.

References Cited

UNITED STATES PATENTS

| | | | |
|---|---|---|---|
| 2,823,149 | 5/1938 | Robinson | 148—187 |
| 3,041,214 | 6/1962 | Goetzberger | 148—187 |
| 3,095,332 | 6/1963 | Ligenza | 148—187 |
| 3,200,019 | 8/1965 | Scott | 148—187 XR |
| 3,298,879 | 7/1967 | Scott | 148—187 |
| 3,303,070 | 8/1967 | Schmidt et al. | 148—187 |

HYLAND BIZOT, *Primary Examiner.*